United States Patent [19]

Lutes

[11] 4,455,626
[45] Jun. 19, 1984

[54] THIN FILM MEMORY WITH MAGNETORESISTIVE READ-OUT

[75] Inventor: Olin S. Lutes, Bloomington, Minn.

[73] Assignee: Honeywell Inc., Minneapolis, Minn.

[21] Appl. No.: 477,056

[22] Filed: Mar. 21, 1983

[51] Int. Cl.³ ............................................. G11C 11/15
[52] U.S. Cl. ....................................... 365/158; 365/57
[58] Field of Search ............................ 365/8, 158, 57; 338/32 R; 360/113

[56] References Cited

U.S. PATENT DOCUMENTS 3,016,507  1/1962  Grant et al. ........................ 365/158
4,356,523  10/1982  Yeh ..................................... 365/158

Primary Examiner—James W. Moffitt
Attorney, Agent, or Firm—Omund R. Dahle

[57] ABSTRACT

A radiation-hard, non-volatile, thin film planar RAM structure fabricated by silicon integrated circuit processing. This memory cell construction provides a magnetoresistive readout. A magnetoresistive film sensor is positioned in the gap of a thicker flux concentrator film. A memory film and the flux concentrator film comprise a magnetic path to the MR film.

19 Claims, 11 Drawing Figures

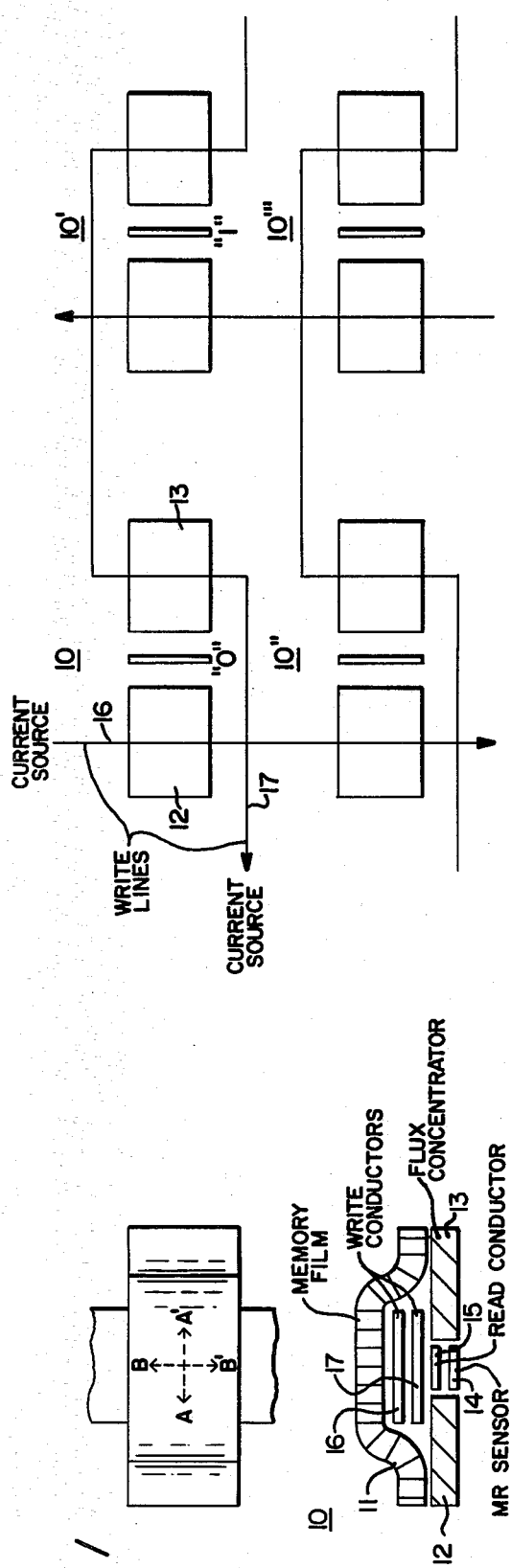
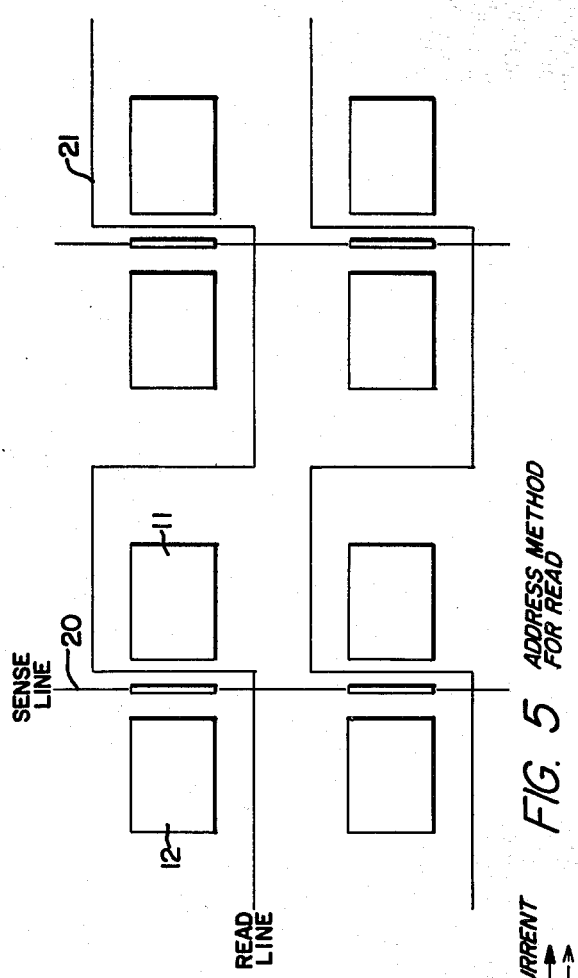
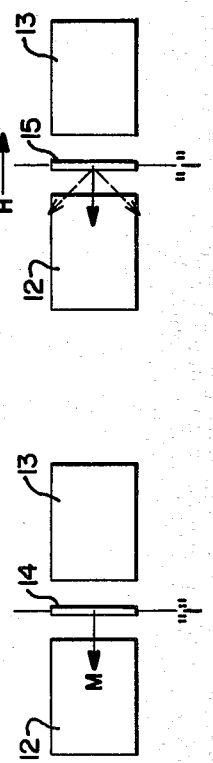
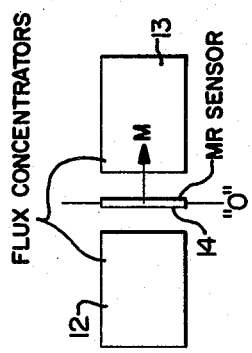
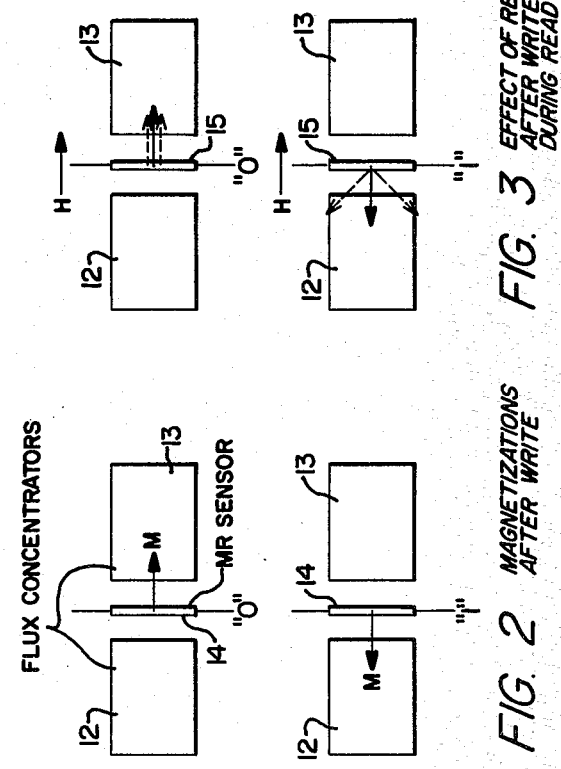

FIG. 6
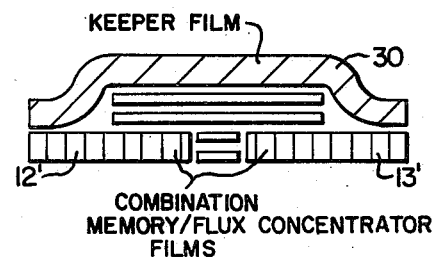
a.
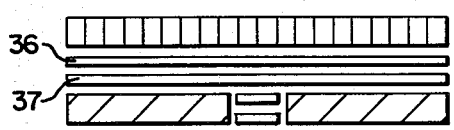
b.
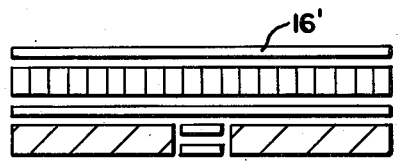
c.
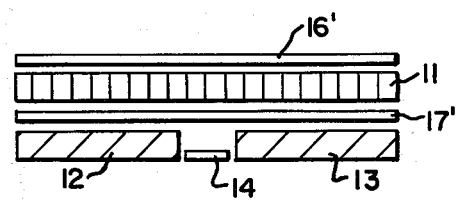
d.
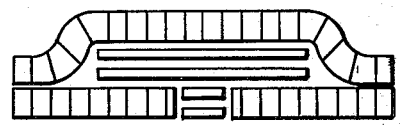
e.
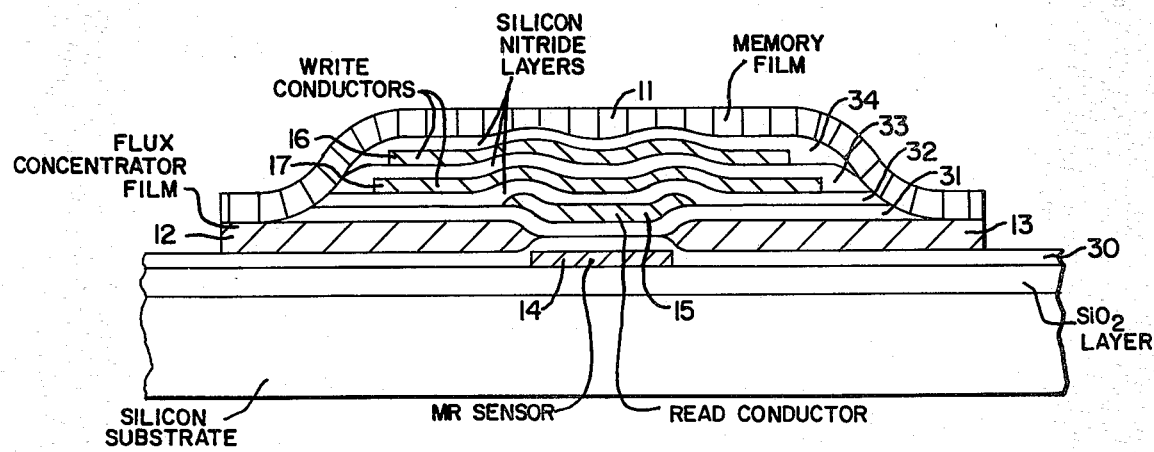
FIG. 7

THIN FILM MEMORY WITH MAGNETORESISTIVE READ-OUT

BACKGROUND AND SUMMARY OF THE INVENTION

This invention is directed to a radiation-hard, nonvolatile planar film memory fabricated by silicon integrated circuit processing. To be described is a memory cell construction which provides coincident current switching and high stability of stored information, based on flux closure and magnetoresistive readout.

In applicant's copending application Ser. No. 384,681 filed on June 3, 1982, entitled "Magnetoresistive Sensor with Enhanced Response and Reduced Bias Field", and assigned to the same assignee as the present invention, there is described a sensor for the detection of external magnetic fields by the use of a thin film magnetoresistive sensor strip located in the gap of a much thicker high permeability magnetic flux concentration film. The flux concentrator greatly increases the magnetic field sensitivity of the magnetoresistive sensor through the flux gathering capability of the thicker flux concentrator film. The copending application is not directed to a magnetic memory.

In the present invention there is described a novel random access memory (RAM) structure in which a magnetoresistive film sensor is positioned in the gap of a thicker film magnetic circuit, the magnetic circuit including at least a memory film and preferably also including a flux concentrator film adjacent the magnetoresistive film.

BRIEF DESCRIPTION OF THE DRAWINGS

FIG. 1 is a cross section view of a basic cell structure of the thin film memory with magnetoresistive readout.

FIG. 2 is a pictorial representation of stored flux in the cell after a "1" or a "0" has been written.

FIG. 3 is a representation of flux changes during readout of a "1" or a "0".

FIG. 4 shows the relation between the memory cell and the current lines for write.

FIG. 5 shows the relation for read.

FIGS. 6a, b, c, d, and e show different embodiments of the cell structure.

FIG. 7 shows an example of integrated construction of the thin film memory with magnetoresistive readout.

DESCRIPTION

First to be considered is a structure of an embodiment of the magnetic planar film memory cell. In FIG. 1 such a memory cell 10 is disclosed in somewhat skeletal form and it will be understood that this figure and subsequent figures are not drawn to scale, being greatly exaggerated particularly in the vertical dimension in order to facilitate explanation. Memory cell 10 comprises several film elements which may be successively deposited by sputtering or evaporation onto a suitable substrate. The magnetic material of the memory film 11 is chosen to have a square hysteresis loop and thus is capable of retaining its stored flux (magnetization) in the absence of an applied magnetic field.

A typical choice for the memory film 11 material is permalloy, having approximately 80Ni 20Fe composition. This material is deposited such as to have an easy-axis magnetization direction corresponding to A-A' in FIG. 1. The form of flux reversal in this direction will be a square loop, as required. The coercivity of the loop can be increased by use of ternary compositions containing Ni, Fe, and Co. The thickness of memory film 11 will typically be 0.1–1 micrometers.

The memory cell 10 also includes flux concentrator film 12 and 13 and a MR (magnetoresistive) film sensing element 14. In this embodiment, film 12, 13 should not have a square hysteresis loop. Instead its flux reversal should be linear, with as little hysteresis as possible. This requirement can still be met using NiFe or NiFeCo material as used in film 11. However, for film 12, 13 the easy-axis direction is oriented during deposition to be at right angles to that of film 11, thus in direction B-B' as shown in FIG. 1. With this orientation the flux in film 12, 13 changes linearly with application of a magnetic field in direction A-A', so long as the flux is below saturation.

Although in the description given, the high permeability of film 12, 13 is achieved by the use of Ni-Fe or Ni-Fe-Co material having the property of uniaxial anisotropy, other high permeability film materials such as amorphous alloys containing Fe, Ni, B, and Si might also be used.

The MR film sensor element 14 is in the form of a long rectangular strip. Element 14 is preferably also a sputtered Ni-Fe or Ni-Fe-Co coating, typically less than about 1000 angstroms in film thickness, and less than about 50 micrometers in width. As an example a sensor 14 might be 5 micrometers in width and about 100 micrometers in length. The elongated MR sensor 14 is positioned in the gap of the relatively thick high permeability 12, 13, which acts as a keeper and flux concentrator for the flux from memory film 11. The thickness of film 12, 13 is chosen so that film 14 is magnetized at saturation in the direction transverse to its long axis, that is, along the direction A-A' in FIG. 1. The exact thickness of film 12, 13 will depend on the magnetic properties of all three film components. It is noted, however, that increasing the thickness of film 12, 13 will tend to increase the flux through film 14, while decreasing the thickness will tend to reduce said flux. The thickness of film 12, 13 will typically be 0.5–2 times that of film 11, and 5–20 times that of film 14.

The memory cell 10 also includes a "read" conductor 15 and two "write" conductors 16 and 17, which are of a highly conductive metallic non-magnetic material such as aluminum or an alloy of aluminum with copper. Not shown in the skeletal drawing of FIG. 1 are the various insulating interlayers between the several films and conductors.

In considering the memory cell operation, and particularly the "write" sequence, a "1" or "0" is written in the cell by application of coincident currents in the two write conductors 16 and 17, the two currents being in the same direction. Current in only one write conductor does not switch the memory film. Magnetic flux remains stored in the memory film 11 following removal of the current. The previous write current direction determines the flux direction, left or right, corresponding to a "1" or "0". The flux from the memory film closes through the high permeability flux concentrators 12 and 13 and through the MR sensor 14 situated in the flux concentrator gap. Because of flux compression due to the large thickness ratio between flux concentrator and MR sensor, a relatively large flux density is present in the MR sensor, resulting in saturation of the MR magnetization transverse to its long axis as discussed above. The direction of the stored flux in the MR sensor is shown in FIG. 2 for the two cases.

Readout, or interrogation, of cell 10 is illustrated in FIG. 3. The binary information is obtained by application of a current to the read conductor strip 15 which is situated above the MR film 14 and parallel to it. In FIG. 3 the MR film 14 is hidden beneath read conductor 15. The current is introduced by read lines to be described below. The read current provides a field H which is transverse to the MR element as shown in FIG. 3. If the flux direction in the stored bit is the same as the read field direction (case of "0" store) little or no change occurs in the resistance of the MR element since no rotation of the magnetization can occur. If the read field direction is opposite to the stored flux direction the resistance will increase due to rotation of the magnetization toward the axis of the MR element. Hence measurement of the resistance change upon application of the read current determines the stored "1" or "0" value.

The method of readout insures stability of the stored bit in the memory film, since the magnetic film furnished by read conductor 15 is localized near sensor film 14. Thus the read field causes little or no disturbance of the "1" or "0" magnetic state of memory film 11. After removal of the read current, the magnetizing force from film 11 causes restoration of the magnetic state and electrical resistance of sensor film 14. Hence, the readout is nondestructive.

A further advantage lies in the transverse magnetic saturation of the MR sensor elements 14 prior to readout. This reduces random resistance variations along a sense line since all elements along the line have the same standard magnetic state and electrical resistance prior to readout.

FIG. 4 indicates an addressing method for "write" and shows a simplified memory matrix of memory cells 10, 10', 10" and 10''' such as are shown in FIGS. 1–3. As shown the memory cells are arranged in rows and columns. The related "write" conductors 16 and 17 are shown extending from one cell to the next cell of the matrix. FIG. 4 shows the relation between the memory cell and the current lines for write. The value of the stored bit is determined by coincident currents furnished by the two sets of current drivers. Directions of currents are illustrated for both a "1" and a "0". (For clarity the write conductors of FIG. 4 are shown as lines passing over the two flux concentrators, whereas in the basic cell of FIG. 1 they are actually strips located one above the other).

FIG. 5 is similar to the previous figure and shows an address method for "read". The cell is read by coincident currents in the MR element 14 and the read conductor strip 15 adjacent to it in the flux concentrator gap. These currents are introduced through sense lines 20 and read lines 21, which may be arranged as shown in FIG. 5. In this figure the conductor strip 15 is not shown. The read line is thus portrayed as going through the gap. The cell to be read is selected by choice of the appropriate sense and read line combination. The cell output can be amplified by on-chip sense amplifiers. Balanced circuits may be used incorporating two sense lines (two cells per bit) or one sense line and a dummy (reference) line.

As was pointed out above, FIG. 1 is one exemplary embodiment of a basic cell structure of the thin film memory with magnetoresistive readout. In FIGS. 6a, b, c, d and e are shown variations in memory cell structure incorporating the same principles. In FIG. 6a a combination memory/flux concentrator film 12' and 13' is fabricated by using a square hysteresis loop material, and a high permeability keeper film 30 replaces the memory film 11 of FIG. 1. In FIG. 6b which is also a modification of FIG. 1, by using wider "write" conductors 36 and 37 an unstepped memory film profile results. FIG. 6c shows an embodiment in which one of the write conductors 16' is placed outside of the memory film, that is, outside the magnetic circuit. In this embodiment the write currents in the two conductors are required to be in opposite directions to switch the memory (upper) film from one state to another, but the method of coincident current write and the method of readout remain the same.

Another variation, shown in FIG. 6d, is to eliminate read conductor 15 and use one of write conductors to read. The read current in the dual purpose write-read conductor 17' produces a magnetic field which couples to the flux concentrator film 12, 13 and also the sensor film 14, producing the required output signal. The magnitude of the read current is insufficient to switch the stored flux in memory film 11. Hence readout is nondestructive, as required. The use of a write-read conductor such as is shown in FIG. 6d is not limited to the unstepped profile shown therein but may also be used in an embodiment similar to FIG. 1.

FIG. 6e shows an embodiment in which both top and bottom films are square loop memory films. The basic features of flux closure, coincident current writing, and non-destructive readout are still attainable in this structure.

Considering now an example of integrated fabrication of the thin film memory (not to scale), there is shown consecutive layer structure in FIG. 7 including a silicon substrate having formed thereon a $SiO_2$ film. The MR sensing film strip 14 is preferably 80Ni 20Fe non-magnetostrictive permalloy which is deposited by sputtering and may be less than about 1000 angstroms thick and less than about 50 micrometers in width and any suitable length long in comparison with its width. An insulating film of silicon nitride 30 is deposited over the sensor 14. The permalloy flux concentrator film 12, and 13 is fabricated to define a gap along the length of the long rectangular sensor 14. In one preferred embodiment this flux concentrator gap was about 10 micrometers wide, with a silicon nitride insulating layer of 1000 angstroms thickness and a concentrator-sensor overlap of 1 to 2 micrometers. Another insulating layer of silicon nitride 31 is deposited over the flux concentrators. The "read" conductor film 15 is deposited above and along the sensor film 14 with insulator 31 between. Silicon nitride layer 32 covers read conductor 15. The write conductors 17 and 16 are then deposited with silicon nitride layers 33 and 34 over them respectively. The memory film 11 of square hysteresis loop material is the top layer completing the consecutive layer structure.

The embodiments of the invention in which an exclusive property or right is claimed are defined as follows:

1. A planar thin-film magnetic memory structure on a substrate comprising:
   a magnetoresistive film sensor formed in a relatively long and narrow thin-film on the substrate;
   a magnetic circuit including magnetic film means comprising at least a memory film, said magnetic circuit defining an elongated gap at and along the position of said magnetoresistive film sensor;

said memory film having a relatively square hysteresis loop;

first and second "write" conductor films formed of highly conductive non-magnetic material, at least one of said "write" conductor films positioned within said magnetic circuit along said elongated gap.

2. The memory structure according to claim 1 wherein the magnetic circuit includes an upper film and a lower film, said lower film including said elongated gap.

3. The memory structure according to claim 2 wherein said upper film is said memory film.

4. The memory structure according to claim 3 wherein said lower film is a high permeability flux concentrator film overlaying an area surrounding said magnetoresistive sensor, said flux concentrator film being relatively thick compared to the thickness of said sensor.

5. The memory structure according to claim 4 wherein said magnetoresistive sensor is a thin film less than about 1000 angstroms in thickness and wherein the thickness of said flux concentrator film is about 5-20 times thicker than said magnetoresistive sensor.

6. The memory structure according to claim 2 wherein said lower film is said memory film and said upper film is a "keeper" film.

7. The memory structure according to claim 3 wherein the other of said "write" conductors is positioned on the opposite side of said upper magnetic film means from said one "write" conductor film.

8. The memory structure according to claim 1 and further comprising:
a "read" conductor film formed of highly conductive non-magnetic material near said elongated gap.

9. The memory structure according to claim 1 wherein said one "write" conductor film also acts as a "read" conductor.

10. A planar thin-film magnetic memory structure on a substrate comprising:
a magnetoresistive sensor formed in a relatively long and narrow thin-film on the substrate;
a high permeability magnetic flux concentrator film overlaying an area surrounding said magnetoresistive sensor, said flux concentrator film being relatively thick compared to the thickness of said sensor, said flux concentrator film having an elongated gap at and along the position of said magnetoresistive sensor;
a "read" conductor film formed of highly conductive non-magnetic material near and along said flux concentrator gap;
first and second "write" conductor films formed of highly conductive non-magnetic material and positioned along said flux concentrator gap; and
a memory film of high coercivity material overlaying the claimed structure.

11. The memory structure according to claim 10 wherein said magnetoresistive sensor is a thin-film less than about 1000 angstroms in thickness.

12. The memory structure according to claim 11 wherein the magnetoresistive sensor thin-film is less than about 50 micrometers in width.

13. The memory structure according to claim 10 wherein the distance across the enlongated gap is less than about 50 micrometers.

14. The memory structure according to claim 10 wherein the thickness of said flux concentrator film is about 5-20 times greater than the thickness of the magnetoresistive sensor film.

15. The memory structure according to claim 10 wherein the magnetoresistive sensor is of 80Ni 20Fe permalloy high permeability magnetic material.

16. A planar thin-film magnetic memory structure on a substrate comprising:
a magnetoresistive sensor formed in a relatively long and narrow thin-film on the substrate;
a high permeability magnetic flux concentrator film overlaying an area surrounding said magnetoresistive sensor, said flux concentrator film being relatively thick compared to the thickness of said sensor, said flux concentrator film having an elongated gap at and along the position of said magnetoresistive sensor;
first and second "write" conductor films formed of highly conductive non-magnetic material, at least one of said "write" conductor films positioned near and along said elongated gap; and
a memory film of high coercivity material overlaying at least one of said "write" conductor films of the claimed structure.

17. The memory structure according to claim 16 and further comprising:
a "read" conductor film formed of highly conductive non-magnetic material near said elongated gap.

18. The memory structure according to claim 16 wherein said one "write" conductor film positioned near and along said elongated gap also acts as a "read" conductor.

19. The memory structure according to claim 16 wherein said memory film overlays both of said first and second "write" conductor film.

* * * * *